(12) United States Patent
Lin et al.

(10) Patent No.: US 11,777,399 B2
(45) Date of Patent: Oct. 3, 2023

(54) POWER DRIVE CIRCUIT AND METHOD OF CONTROLLING THE SAME

(71) Applicant: DELTA ELECTRONICS, INC., Taoyuan (TW)

(72) Inventors: Yi-Wei Lin, Taoyuan (TW); Kai-Wei Hu, Taoyuan (TW); Lei-Chung Hsing, Taoyuan (TW)

(73) Assignee: DELTA ELECTRONICS, INC., Taoyuan (TW)

(*) Notice: Subject to any disclaimer, the term of this patent is extended or adjusted under 35 U.S.C. 154(b) by 170 days.

(21) Appl. No.: 17/468,919

(22) Filed: Sep. 8, 2021

(65) Prior Publication Data
US 2022/0231592 A1  Jul. 21, 2022

(30) Foreign Application Priority Data
Jan. 15, 2021 (CN) .......................... 202110055433.7

(51) Int. Cl.
| H02M 1/08 | (2006.01) |
| H02M 7/53 | (2006.01) |
| H03K 17/16 | (2006.01) |
| H02M 1/00 | (2006.01) |

(52) U.S. Cl.
CPC .......... H02M 1/08 (2013.01); H02M 1/0029 (2021.05); H03K 17/168 (2013.01)

(58) Field of Classification Search
CPC ........ H02M 1/0029; H02M 1/08; H02M 7/48; H02M 7/53; H03K 17/168
USPC ......................................... 327/108, 109, 110
See application file for complete search history.

(56) References Cited

U.S. PATENT DOCUMENTS

2021/0083663 A1* 3/2021 Nagano ................ H03K 17/165

* cited by examiner

Primary Examiner — William Hernandez
(74) Attorney, Agent, or Firm — Muncy, Geissler, Olds & Lowe, P.C.

(57) ABSTRACT

A power drive circuit includes a power conversion module, a plurality of gate drivers, a waveform processing unit, a control unit, a weighting unit, and a comparator. Each gate driver includes a drive resistance setting value. The waveform processing unit outputs a current absolute value waveform of an AC power. The weighting unit generates a trigger voltage. When the comparator determines that the current absolute value waveform is greater than the trigger voltage, the comparator outputs a slew rate control signal to each of the gate drivers. When the gate driver receives the slew rate control signal, each of the gate drivers decreases the drive resistance setting value of the gate driver.

15 Claims, 10 Drawing Sheets

POWER DRIVE CIRCUIT AND METHOD OF CONTROLLING THE SAME

BACKGROUND

Technical Field

The present disclosure relates to a power drive circuit and a method of controlling the same, and more particularly to a power drive circuit with dynamic adjustment of drive resistance setting values and a method of controlling the same.

Description of Related Art

The statements in this section merely provide background information related to the present disclosure and do not necessarily constitute prior art.

Power switching components, such as MOSFET, IGBT, SiC-MOSFET, and GaN, are widely used in power electronic systems, such as front-end converters, vehicle charging systems, or drive inverters, and these power switching components will cause switching losses during the energy conversion process. In response to the trend of low loss and high efficiency, the gate drive resistance value of the power switching component will be adjusted and the resistance value will be gradually reduced so that the overlap area of the power switching component during the switching process is reduced, thereby reducing loss and increasing efficiency. However, blindly reducing the drive resistance value, the slopes of the voltage change (dv/dt) and current change (di/dt) during the switching process will gradually increase, causing the parasitic inductance and coupling capacitance in the wire to oscillate so as to exceed the operation limitation of the EMI specification. Therefore, how to achieve the best operating characteristics requires a balance between two aspects.

Figure 1A:
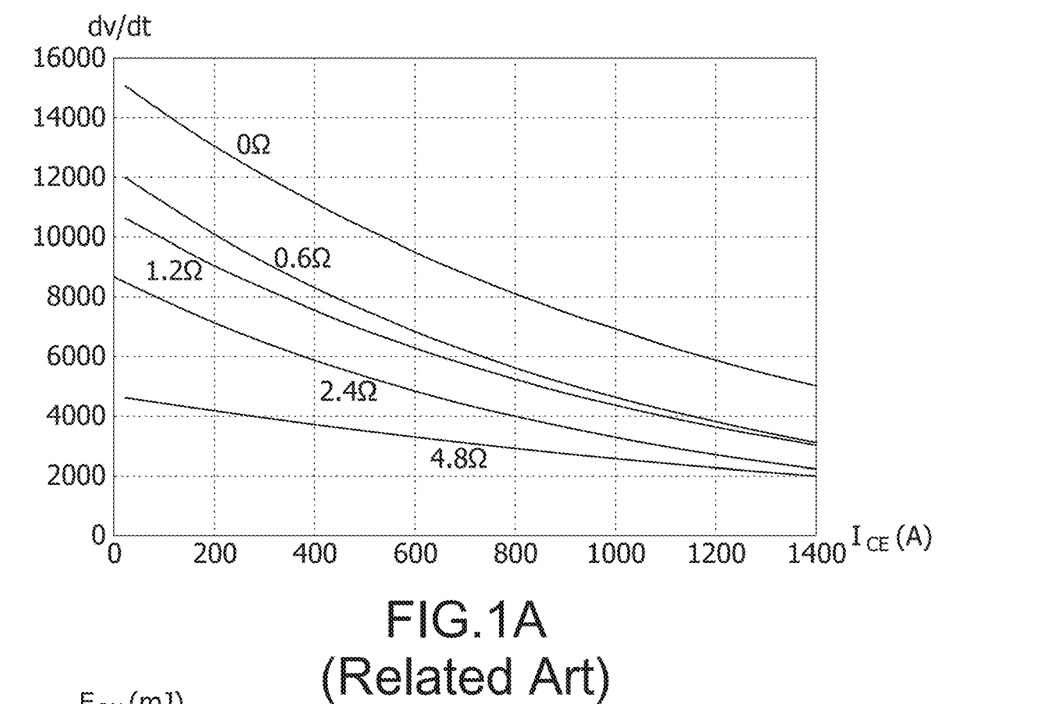
FIG. 1A is a curve diagram of a turned-on voltage slope by using a double-pulse test platform.
Figure 1B:
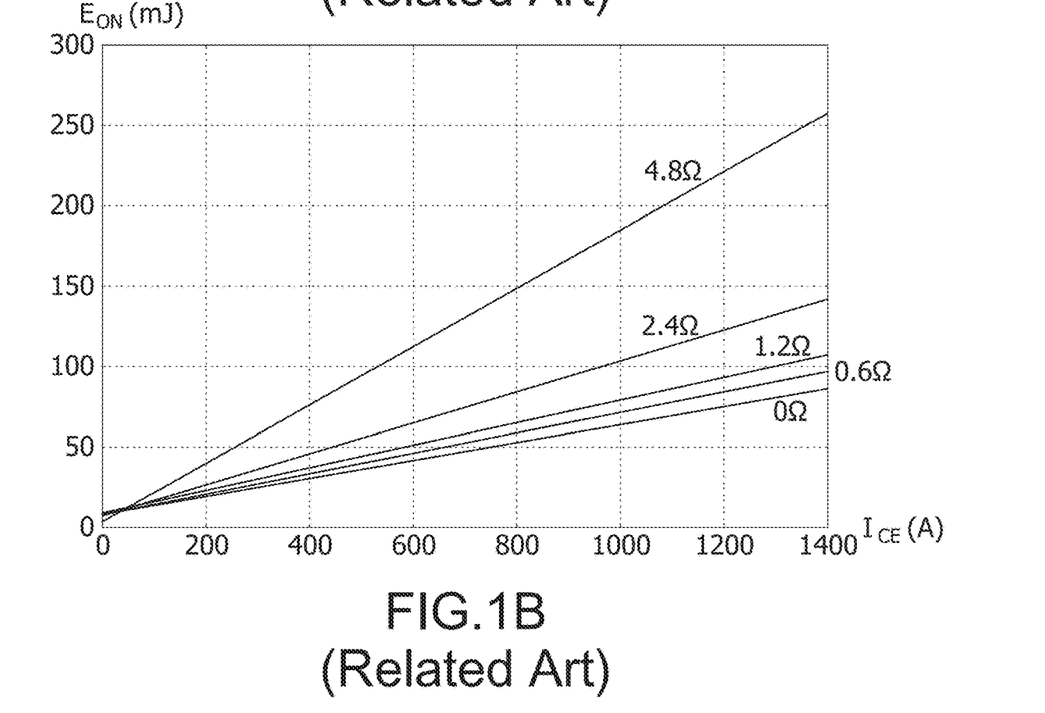
FIG. 1B is a curve diagram of a switching loss by using the double-pulse test platform.

FIG. 1A and FIG. 1B shows curve diagrams of performance verification of the model (2MBI1400VXB-IGBT module) of Fuji by using a double-pulse test platform. FIG. 1A shows the turned-on voltage slope dv/dt of the drive resistance value RG-On from 0Ω to 4.8Ω, and FIG. 1B shows the switching loss $E_{ON}$ of the drive resistance value RG-On from 0Ω to 4.8Ω.

Restricted specifications or circuit configuration restrictions, if the turned-on voltage slope dv/dt is designed to be lower than 9 kV/s, the drive resistance value used in 2MBI1400VXB-IGBT module needs to be equal to or higher than 2.4Ω as shown in FIG. 1A. The selection of the drive resistance value also determines the operation behaviors of the turned-on voltage slope dv/dt and the switching loss $E_{ON}$, that is, as the current $I_{CE}$ flowing through the power switch components gradually increases, the switching loss $E_{ON}$ also increases, but the turned-on voltage slope dv/dt starts to decrease. If the drive resistance value can be switched from 2.4Ω to 0Ω when the current $I_{CE}$ is higher than 800 A, not only the design requirement of upper-limited 9 kV/s slope can be maintained but the switching loss $E_{ON}$ can also be greatly reduced. Based on this idea, a slew rate control (SRC) drive method is gradually replacing the traditional circuit architecture.

The traditional SRC function activation method uses the current and temperature information of the power switching component as the determination condition, and the acquired information is controlled by the hardware circuit or firmware procedure. The advantages and disadvantages of these two methods will be described below.

Figure 2:
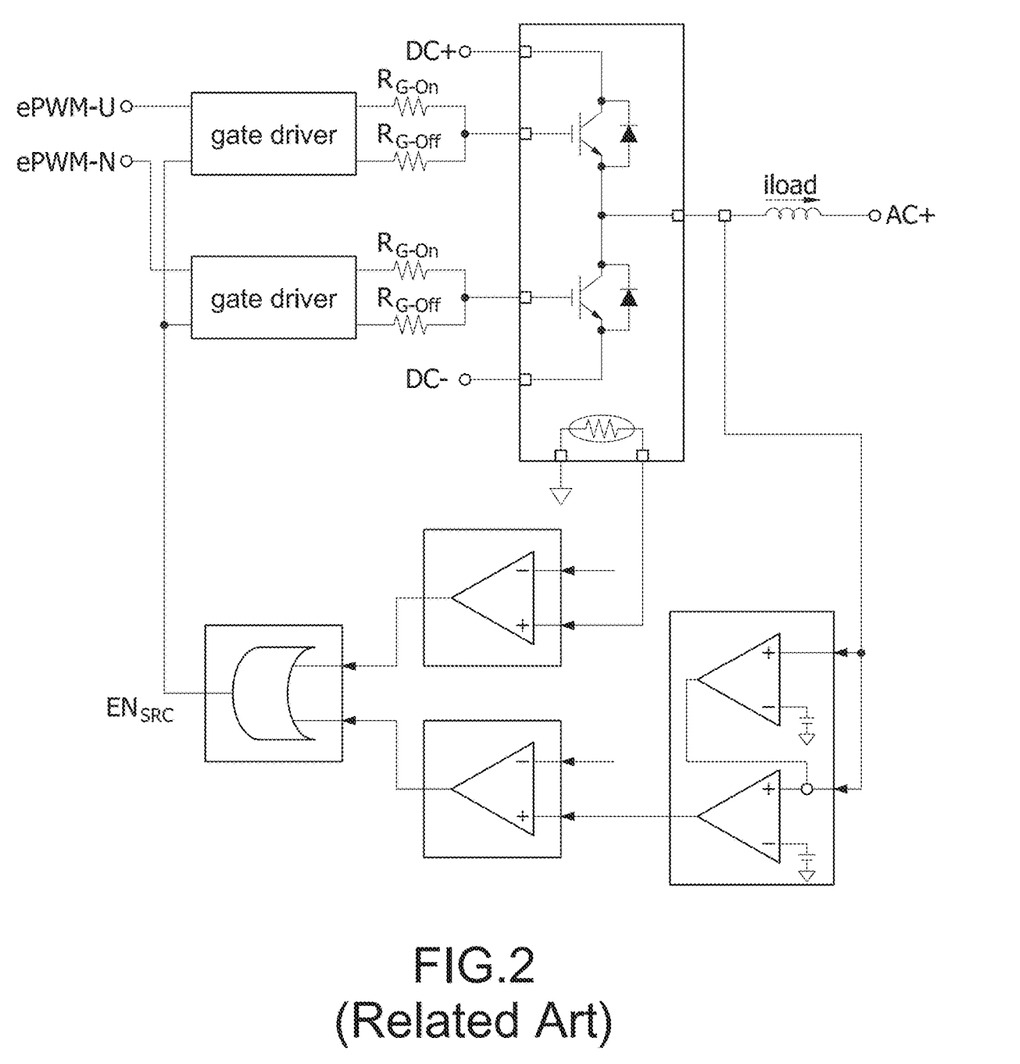
FIG. 2 is a block circuit diagram of generating a slew rate control signal by an existing hardware circuit.

Using the hardware circuit to detect current and temperature information to control $EN_{SRC}$ signal is shown in FIG. 2. The load current feedback information is compared with the preset current level through the signal processing circuit. When the load current is higher than the current level, the $EN_{SRC}$ signal is set to the activation state, and vice versa. In addition, the temperature information can also be used as the activation determination. When the temperature exceeds the determination point at which the SRC function needs to be activated, the $EN_{SRC}$ signal is set to the activation state to reduce the switching loss and the operation temperature of the power switching component. FIG. 2 shows an example of single-phase output. In the three-phase system, the same signal and comparison configuration need to be added to three groups. The added components will affect the volume and size of the circuit board, and the temperature and current determination circuit can be selected according to actual needs.

Figure 3:
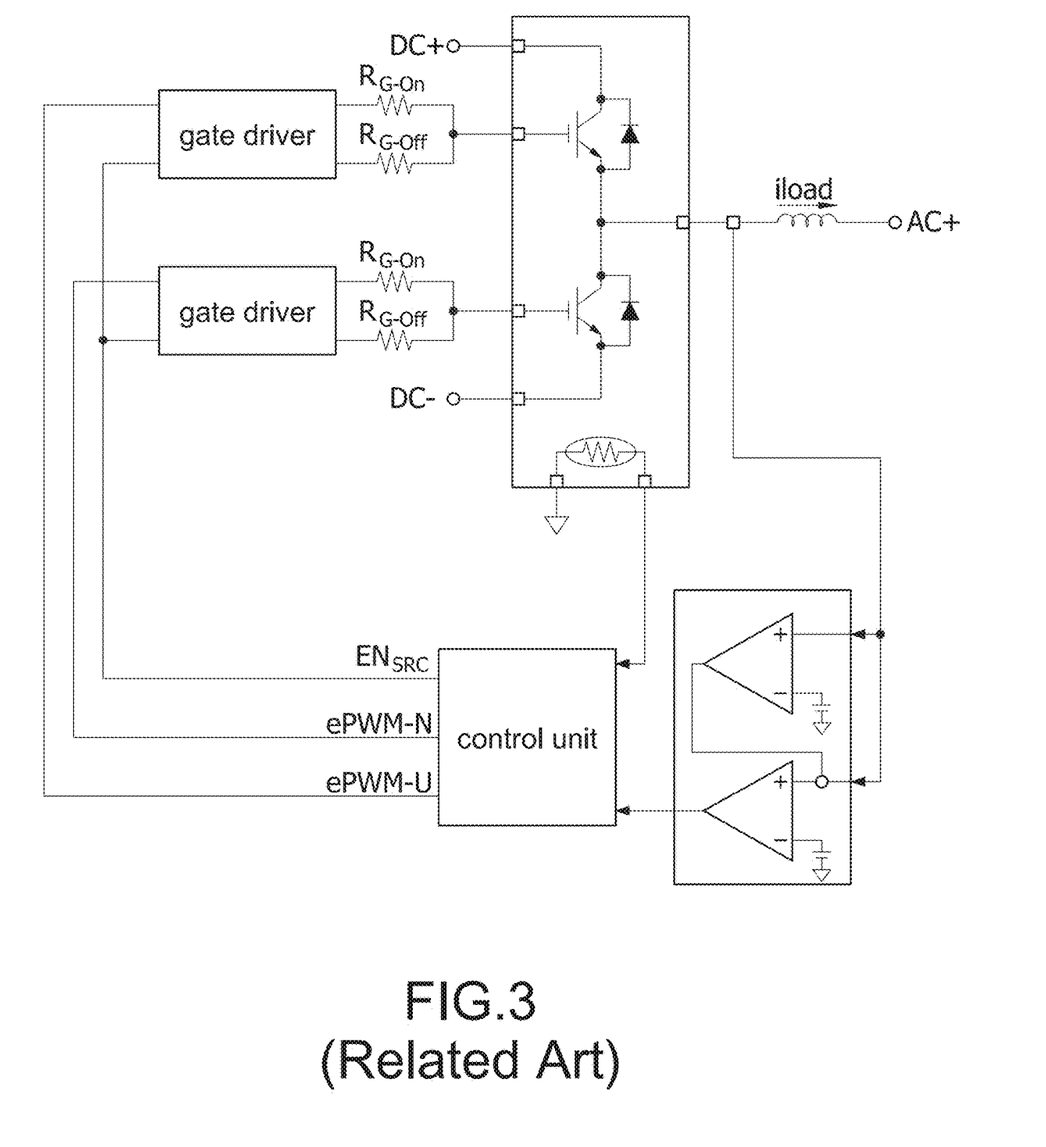
FIG. 3 is a block circuit diagram of generating the slew rate control signal by an existing firmware.

Using the firmware procedure to determine the activation of the SRC function as shown in FIG. 3. Compared with the hardware configuration that requires complicated circuit components and increased circuit board manufacturing space, the use of the microprocessor (control unit) itself will acquire characteristics such as current and temperature information, and the SRC drive method may be realized by writing highly flexible procedures.

Figure 4:
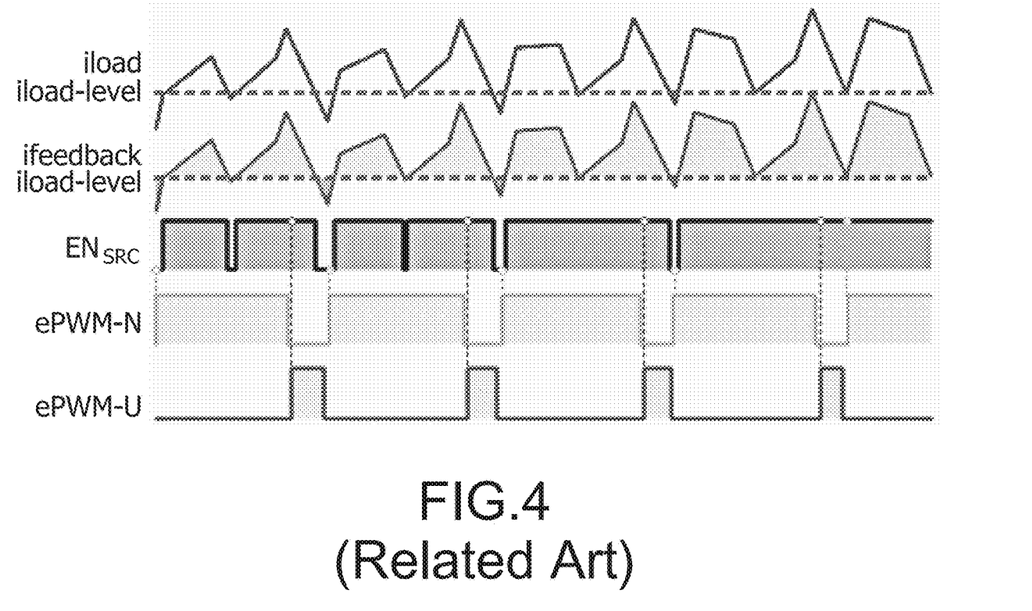
FIG. 4 is a schematic waveform of misjudgment by using the existing hardware circuit.

However, the use of hardware circuit or firmware procedure for determination and control has its disadvantages. As shown in FIG. 4, although the hardware circuit implementation will require additional components, it not only reduces the efficiency of the layout of the circuit board but also the comparison level of the SRC cannot be modified since the components are selected. However, its fast response can robustly reflect the rapid changes of the comparative signal to increase the use accuracy of the SRC function. Although the firmware procedure improves the circuit board layout and comparison level control problems, but it is limited by the microprocessor's sampling of the sensing signal, which will occur in the rapid change of the sensing signal, and the SRC function may be used incorrectly.

Figure 5:
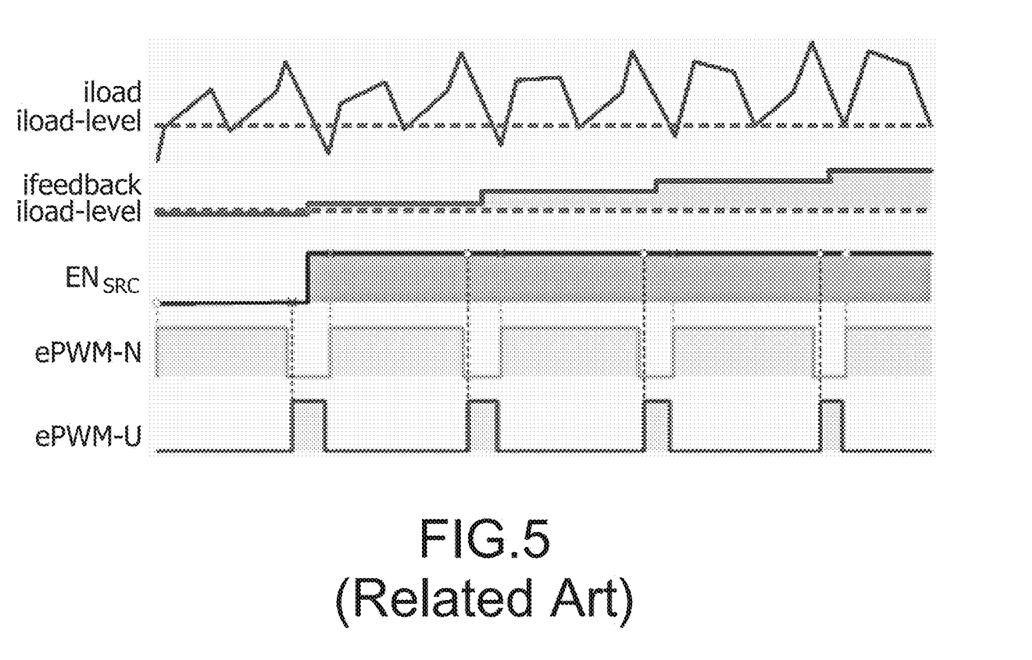
FIG. 5 is a schematic waveform of misjudgment by using the existing firmware.

Using the current information as a reference for SRC comparison level is shown in FIG. 5. In actual circuit operation, due to the problem of microprocessor signal sampling, the operation characteristics of current ripple are ignored in the firmware implementation of the SRC method so that the power switching component cannot operate according to the expected result once the activation signal $EN_{SRC}$ is incorrect.

Therefore, a power drive circuit and a method of controlling the same are proposed to dynamically and flexibly adjust the drive resistance setting values of the gate drivers according to the optimization procedure to have a high-accurate SRC function activation capability in different occasions by adopting the characteristics of high response action of the hardware circuit to the sensing signal and using the weighting circuit combined with the firmware procedure.

SUMMARY

An object of the present disclosure is to provide a power drive circuit to solve problems of the existing technology.

In order to achieve the above-mentioned object, the present disclosure provides a power drive circuit. The power drive circuit includes a power conversion module, a plurality of gate drivers, a waveform processing unit, a control unit, a weighting unit, and a comparator. The power conversion module includes a plurality of switches, and the power conversion module receives a DC power source and outputs an AC power. Each of the gate drivers is correspondingly connected to a control end of each of the switches, and each of the gate drivers has a drive resistance setting value. The waveform processing unit is coupled to an AC current signal of the AC power to output a current absolute value waveform of the AC current signal. The control unit adjusts a duty cycle of a first PWM signal according to the DC power source and an AC voltage signal of the AC power to output a second PWM signal. The weighting unit acquires an average voltage of the second PWM signal and superimposes the average voltage and a trigger level signal to generate a trigger voltage. The comparator outputs a slew rate control signal to each of the gate drivers when the comparator determines that the current absolute value waveform is greater than the trigger voltage. When each of the gate drivers receives the slew rate control signal, each of the gate drivers decreases the corresponding drive resistance setting value.

In one embodiment, when the comparator determines that current absolute value waveform is not greater than the trigger voltage, the comparator stops outputting the slew rate control signal to restore the drive resistance setting value of each of the gate drivers.

In one embodiment, the control unit further detects a working temperature of the power conversion module; when the control unit determines that the working temperature is higher than a temperature threshold value, the control unit adjusts the duty cycle of the first PWM signal to be zero.

In one embodiment, the control unit controls the plurality of gate drivers to selectively turn on or turn off the switches according to the current absolute value waveform.

In one embodiment, the waveform processing unit includes a first operation unit and a second operation unit. The first operation unit receives a reference voltage. The first operation unit reverses the AC current signal to generate a first processing waveform, and the first operation unit retains a part of the first processing waveform lower than the reference voltage to form a second processing waveform. The second operation unit amplifies the second processing waveform to generate a third processing waveform. The second operation unit superimposes the third processing waveform and the AC current signal to form a fourth processing waveform. The second operation unit reverses the fourth processing waveform to output the current absolute value waveform.

In one embodiment, the first operation unit includes a first operational amplifier, a first resistor, a second resistor, a third resistor, a first diode, and a second diode. The first operational amplifier has a negative input end, a positive input end, and an output end. A first end of the first resistor is coupled to the AC current signal, and a second end of the first resistor is connected to the negative input end of the first operational amplifier. A first end of the second resistor is coupled to the reference voltage, and a second end of the second resistor is connected to the positive input end of the first operational amplifier. A first end of the third resistor is connected to the second end of the first resistor. An anode of the first diode is connected to a second end of the third resistor. A cathode of the second diode is connected to the second end of the first resistor, and an anode of the second diode is connected to a cathode of the first diode and the output end of the first operational amplifier to produce the second processing waveform.

In one embodiment, the second operation unit includes a fourth resistor, a fifth resistor, a sixth resistor, a second operational amplifier, and a seventh resistor. A first end of the fourth resistor is connected to the second end of the third resistor. A first end of the fifth resistor is connected to the first end of the first resistor, and a second end of the fifth resistor is connected to a second end of the fourth resistor. A first end of the sixth resistor is connected to the second end of the fifth resistor and the second end of the fourth resistor. The second operational amplifier has a negative input end, a positive input end, and an output end. The negative input end of the second operational amplifier is connected to the first end of the sixth resistor, and the output end of the second operational amplifier is connected to a second end of the sixth resistor. A first end of the seventh resistor is connected to the first end of the second resistor, and a second end of the seventh resistor is connected to the positive input end of the second operational amplifier.

In one embodiment, a value of the fourth resistor is half a value of the sixth resistor.

In one embodiment, the weighting unit includes a low-pass filter, an eighth resistor, and a ninth resistor. The low-pass filter receives the second PWM signal to output the average voltage of the second PWM signal. A first end of the eighth resistor receives the average voltage. A first end of the ninth resistor is coupled to the trigger level signal, and a second end of the ninth resistor is connected to a second end of the eighth resistor to generate the trigger voltage.

In one embodiment, a relational formula between the trigger voltage, the average voltage, and the trigger level signal is: $Vx=(V1 \times R9)/(R8+R9)+(V2 \times R8)/(R8+R9)$.

Accordingly, the proposed power drive circuit can dynamically and flexibly adjust the drive resistance setting values of the gate drivers according to the optimization procedure to have a high-accurate SRC function activation capability in different occasions by adopting the characteristics of high response action of the hardware circuit to the sensing signal and using the weighting circuit combined with the firmware procedure.

Another object of the present disclosure is to provide a method of controlling a power drive circuit to solve problems of the existing technology.

In order to achieve the above-mentioned object, the present disclosure provides a method of controlling a power drive circuit. The power drive circuit includes a power conversion module and a plurality of gate drivers, each of the gate drivers correspondingly is connected to each of a plurality of switches of the power conversion module, and each of the gate drivers has a drive resistance setting value. The method includes steps of: converting, by the power conversion module, a DC power source into an AC power, executing an absolute value operation procedure to acquire a current absolute value waveform of an AC current signal of the AC power, adjusting a duty cycle of a first PWM signal to form a second PWM signal according to the DC power source and an AC voltage signal of the AC power, acquiring an average voltage of the second PWM signal, superimposing the average voltage and a trigger level signal to generate a trigger voltage, and comparing the current absolute value waveform and the trigger voltage. When the current absolute value waveform is greater than the trigger voltage, outputting a slew rate control signal to each of the gate drivers. When each of the gate drivers receives the slew rate control signal, decreasing the corresponding drive resistance setting value of each of the gate drivers.

In one embodiment, when the current absolute value waveform is not greater than the trigger voltage, the comparator stops outputting the slew rate control signal to restore the drive resistance setting value of each of the gate drivers.

In one embodiment, the method further includes steps of: detecting a working temperature of the power conversion module, and adjusting the duty cycle of the first PWM signal to be zero when the working temperature is higher than a temperature threshold value.

In one embodiment, the method further includes a step of: controlling the gate drivers to selectively turn on or turn off the switches according to the current absolute value waveform.

In one embodiment, the absolute value operation procedure includes steps of: reversing the AC current signal to generate a first processing waveform, retaining a part of the first processing waveform lower than the reference voltage to form a second processing waveform, amplifying the second processing waveform to generate a third processing waveform, superimposing the third processing waveform and the AC current signal to form a fourth processing waveform, and reversing the fourth processing waveform to output the current absolute value waveform.

Accordingly, the proposed method of operating the power drive circuit can dynamically and flexibly adjust the drive resistance setting values of the gate drivers according to the optimization procedure to have a high-accurate SRC function activation capability in different occasions by adopting the characteristics of high response action of the hardware circuit to the sensing signal and using the weighting circuit combined with the firmware procedure.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The present disclosure can be more fully understood by reading the following detailed description of the embodiment, with reference made to the accompanying drawing as follows.

DETAILED DESCRIPTION

Reference will now be made to the drawing figures to describe the present disclosure in detail. It will be understood that the drawing figures and exemplified embodiments of present disclosure are not limited to the details thereof.

Figure 6:
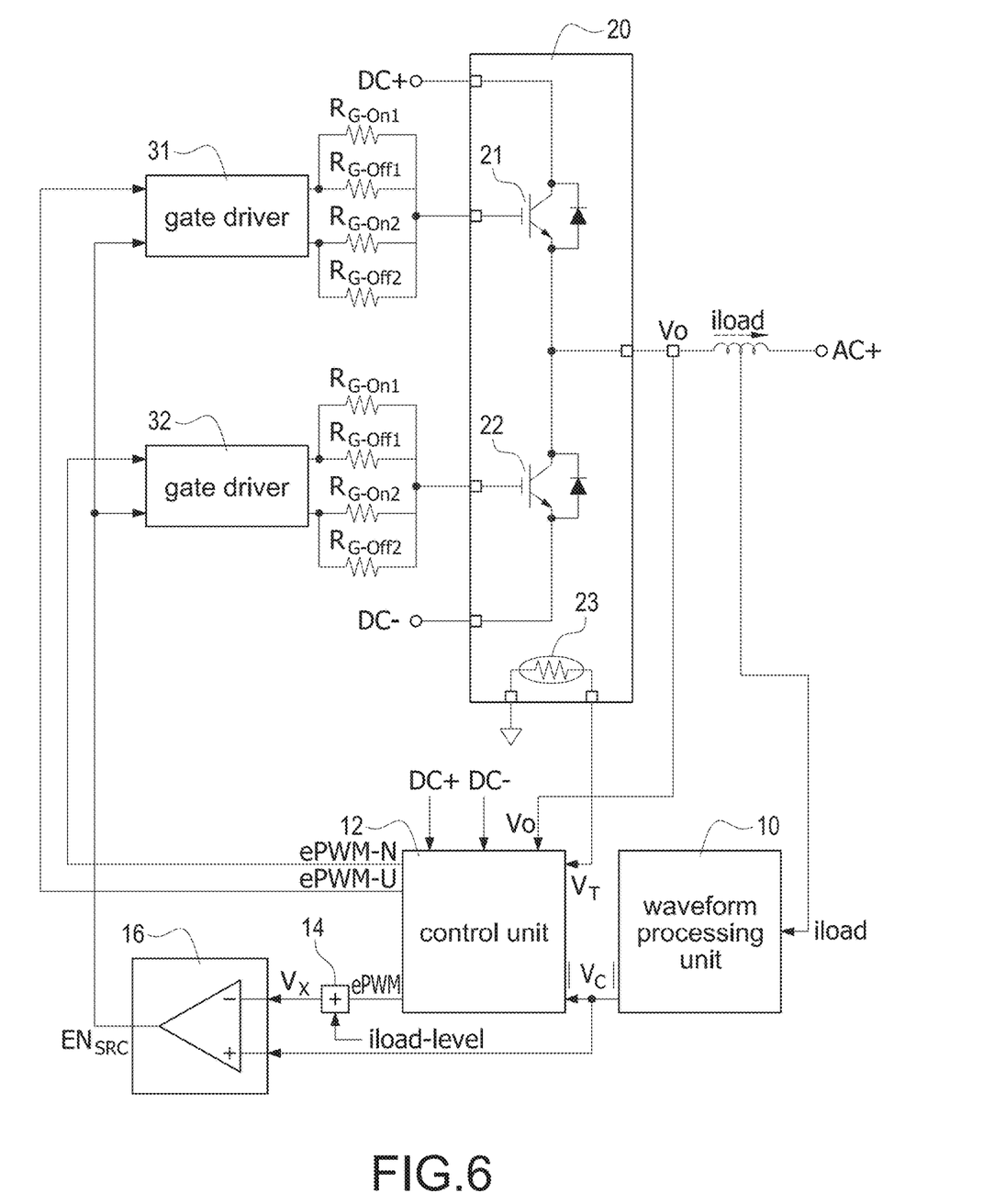
FIG. 6 is a block circuit diagram of a power drive circuit according to the present disclosure.

Please refer to FIG. 6, which shows a block circuit diagram of a power drive circuit according to the present disclosure. The power drive circuit includes a power conversion module 20, a plurality of gate drivers 31, 32, a waveform processing unit 10, a control unit 12, a weighting unit 14, and a comparator 16. The power conversion module 20 includes a plurality of switches 21, 22. In one embodiment, each switch 21, 22 is, for example but not limited to, an IGBT (insulated gate bipolar transistor). The power conversion module 20 receives a DC power source DC+, DC− and outputs an AC power including an AC voltage signal Vo and an AC current signal iload.

Each of the gate drivers 31, 32 is connected to a control end (such as a gate, take IGBT as an example) of each switch 21, 22, and each gate driver 31, 32 has a drive resistance setting value $R_{G\text{-}On1}$, $R_{G\text{-}Off1}$, $R_{G\text{-}On2}$, $R_{G\text{-}Off2}$, the detailed description will be made as follows.

The waveform processing unit 10 is coupled to the AC current signal iload of the AC power to output a current absolute value waveform |Vc| of the AC current signal iload. Please refer to FIG. 7 and FIG. 8, which show a circuit diagram of a waveform processing unit and a schematic waveform of operating the waveform processing unit according to the present disclosure, respectively. The waveform processing unit 10 includes a first operation unit and a second operation unit. The first operation unit receives a reference voltage Vos. The first operation unit reverses the AC current signal iload to generate a first processing waveform. The first operation unit retains a part of the first processing waveform lower than the reference voltage Vos to form a second processing waveform Va shown in FIG. 8(b). The second operation unit amplifies the second processing waveform Va to generate a third processing waveform. The second operation unit superimposes the third processing waveform and the AC current signal iload to form a fourth processing waveform shown in FIG. 8(c). The second operation unit reverses the fourth processing waveform to output the current absolute value waveform |Vc| shown in FIG. 8(d).

In some embodiments, the control unit 12 respectively adjusts duty cycles of control signals ePWM-N, ePWM-U according to the magnitude of the current absolute value waveform |Vc| outputted from the waveform processing unit 10 so as to control gate drivers 31, 32 to selectively turn on or turn off the switches 21, 22.

In some embodiments, the waveform processing unit 10 usually provides a current sensor (not shown), such as a Hall sensor. Therefore, the waveform processing unit 10 can detect/sense and receive the AC current signal iload of the AC power. However, the present disclosure is not limited thereto.

Figure 7:
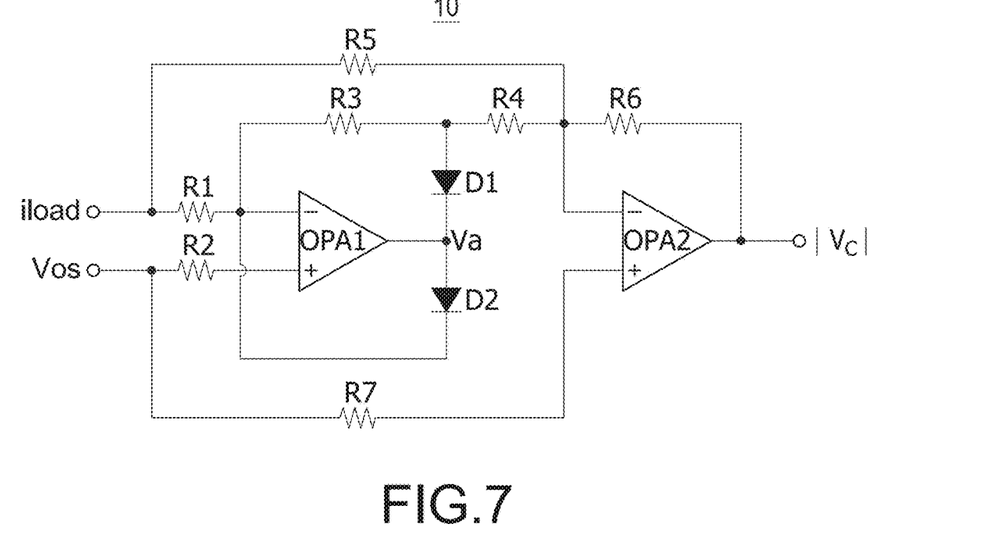
FIG. 7 is a circuit diagram of a waveform processing unit according to the present disclosure.
Figure 8:
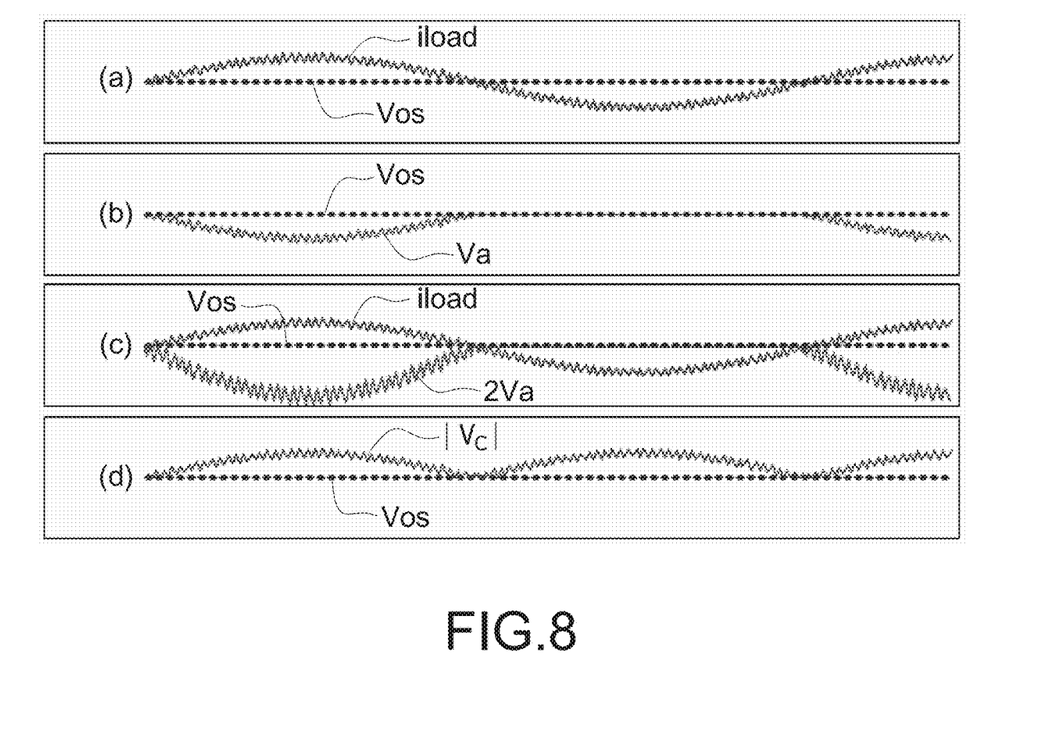
FIG. 8 is a schematic waveform of operating the waveform processing unit according to the present disclosure.

Specifically, the first operation unit includes a first operational amplifier OPA1, a first resistor R1, a second resistor R2, a third resistor R3, a first diode D1, and a second diode D2. The first operational amplifier OPA1 has a negative input end, a positive input end, and an output end. A first end of the first resistor R1 is coupled to the AC current signal iload, and a second end of the first resistor R1 is connected to the negative input end of the first operational amplifier OPA1. A first end of the second resistor R2 is coupled to the reference voltage Vos, and a second end of the second resistor R2 is connected to the positive input end of the first operational amplifier OPA1. A first end of the third resistor R3 is connected to the second end of the first resistor R1. An anode of the first diode D1 is connected to a second end of the third resistor R3. A cathode of the second diode D2 is connected to the second end of the first resistor R1, and an anode of the second diode D2 is connected to a cathode of the first diode D1 and the output end of the first operational amplifier OPA1 to generate the second processing waveform Va. In some embodiments, the first end of the first resistor R1 is, for example but not limited to, connected to a current sensor (not shown) of the waveform processing unit 10 to receive the AC current signal iload. However, the present disclosure is not limited thereto.

The second operation unit includes a fourth resistor R4, a fifth resistor R5, a sixth resistor R6, a second operational amplifier OPA2, and a seventh resistor R7. A first end of the fourth resistor R4 is connected to the second end of the third resistor R3. A first end of the fifth resistor R5 is connected to the first end of the first resistor R1, and a second end of the fifth resistor R5 is connected to a second end of the fourth resistor R4. A first end of the sixth resistor R6 is connected to the second end of the fifth resistor R5 and the second end of the fourth resistor R4. The second operational amplifier OPA2 has a negative input end, a positive input end, and an output end. The negative input end of the second operational amplifier OPA2 is connected to the first end of the sixth resistor R6, and the output end of the second operational amplifier OPA2 is connected to a second end of the sixth resistor R6. A first end of the seventh resistor R7 is connected to the first end of the second resistor R2, and a second end of the seventh resistor R7 is connected to the positive input end of the second operational amplifier OPA2. The waveform processing unit 10 shown in FIG. 7 is one of the circuits that can be implemented. However, the implementation circuit is not limited to the present disclosure. Any circuit that can be used as a signal absolute operation can be used as the waveform processing unit of the present disclosure.

In some embodiments, a value of the fourth resistor R4 is, for example but not limited to, half a value of the sixth resistor R6. Therefore, the third processing waveform 2*Va is twice the second processing waveform Va amplified by the second operation unit.

The control unit 12 receives the DC power source DC+, DC− and the AC voltage signal Vo of the AC power, and adjusts a duty cycle of a first PWM signal (not shown) to output a second PWM (pulse-width modulation) signal ePWM according to the DC power source DC+, DC− and the AC voltage signal Vo. Compared with the first PWM signal, the second PWM signal ePWM is a signal that its duty cycle has been adjusted. In this embodiment, the control unit 12 may be a digital controller with functions of digital signal process, calculation, and control, such as a microcontroller (MCU), a digital signal processor (DSP), a field-programmable gate array (FPGA), or an application-specific integrated circuit (ASIC).

In other embodiments, the first PWM signal is a signal provided in the control unit 12. The control unit 12 usually adjusts the duty cycle of the first PWM signal to output the second PWM signal ePWM according to the DC power source DC+, DC− received by the power conversion module 20 and/or the AC power (including the AC voltage signal Vo and/or the AC current signal iload) outputted from the power conversion module 20.

The weighting unit 14 acquires an average voltage V1 of the second PWM signal ePWM, and superimposes the average voltage V1 and a trigger level signal iload-level to generate a trigger voltage Vx, the detailed description will be made as follows. The comparator 16 is coupled to the weighting unit 14 and the waveform processing unit 10. The comparator 16 receives the trigger voltage Vx and the current absolute value waveform |Vc| and compares the trigger voltage Vx with the current absolute value waveform |Vc|, the detailed description will be made as follows. When the comparator 16 determines that the current absolute value waveform |Vc| is greater than the trigger voltage Vx, the comparator 16 outputs a slew rate control signal $EN_{SRC}$ to each of the gate drivers 31, 32.

When each of the gate drivers 31, 32 does not receive the slew rate control signal $EN_{SRC}$, and the control signal ePWM-U outputted from the control unit 12 turns on the upper switch 21 of the power conversion module 20 and the control signal ePWM-N outputted from the control unit 12 turns off the lower switch 22 of the power conversion module 20, the drive resistance setting value $R_{G\text{-}On1}$ of the gate driver 31 and the drive resistance setting value $R_{G\text{-}Off1}$ of the gate driver 32 are set to be operated. On the contrary, when the control signal ePWM-U outputted from the control unit 12 turns off the upper switch 21 and the control signal ePWM-N outputted from the control unit 12 turns on the lower switch 22, the drive resistance setting value $R_{G\text{-}Off1}$ of the gate driver 31 and drive resistance setting value $R_{G\text{-}On1}$ of the gate driver 32 are set to be operated.

When each of the gate drivers 31, 32 receives the slew rate control signal $EN_{SRC}$, more resistors are connected in parallel to reduce the drive resistance setting value $R_{G\text{-}On1}$, $R_{G\text{-}Off1}$, $R_{G\text{-}On2}$, $R_{G\text{-}Off2}$ of each of the gate drivers 31, 32. When each of the gate drivers 31, 32 receives the slew rate control signal $EN_{SRC}$, the drive resistance setting value of each of the gate drivers 31, 32 is determined by the parallel-connected drive resistance setting values $R_{G\text{-}On1}$, $R_{G\text{-}Off1}$, $R_{G\text{-}On2}$, $R_{G\text{-}Off2}$ so that the drive resistance setting value of each of the gate drivers 31, 32 will be reduced since all the drive resistance setting values are in parallel.

For example, when each of the gate drivers 31, 32 receives the slew rate control signal $EN_{SRC}$, and the control signals ePWM-U, ePWM-N outputted from the control unit 12 respectively turn on the upper switch 21 and turn off the lower switch 22, the drive resistance setting values $R_{G\text{-}On1}$, $R_{G\text{-}On2}$ of the gate driver 31 are in parallel, and the drive resistance setting values $R_{G\text{-}off1}$, $R_{G\text{-}Off2}$ of the gate driver 32 are in parallel. Similarly, when each of the gate drivers 31, 32 receives the slew rate control signal $EN_{SRC}$, and the control signals ePWM-U, ePWM-N outputted from the control unit 12 respectively turn off the upper switch 21 and turn on the lower switch 22, the drive resistance setting values $R_{G\text{-}Off1}$, $R_{G\text{-}Off2}$ of the gate driver 31 are in parallel, and the drive resistance setting values $R_{G\text{-}On1}$, $R_{G\text{-}On2}$ of the gate driver 32 are in parallel. Therefore, when each of the gate drivers 31, 32 receives the slew rate control signal $EN_{SRC}$, the drive resistor values connected to the upper switch 21 and the lower switch 22 are reduced so that the switching losses of the upper switch 21 and the lower switch 22 are decreased, as shown in FIG. 1B.

Figure 9:
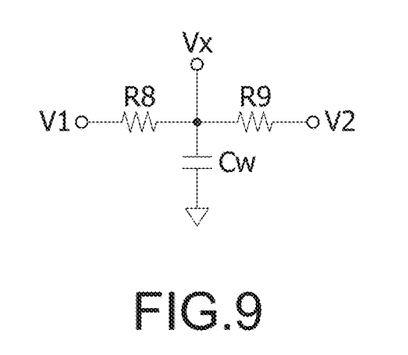
FIG. 9 is a circuit diagram of a weighting unit according to the present disclosure.
Figure 10:
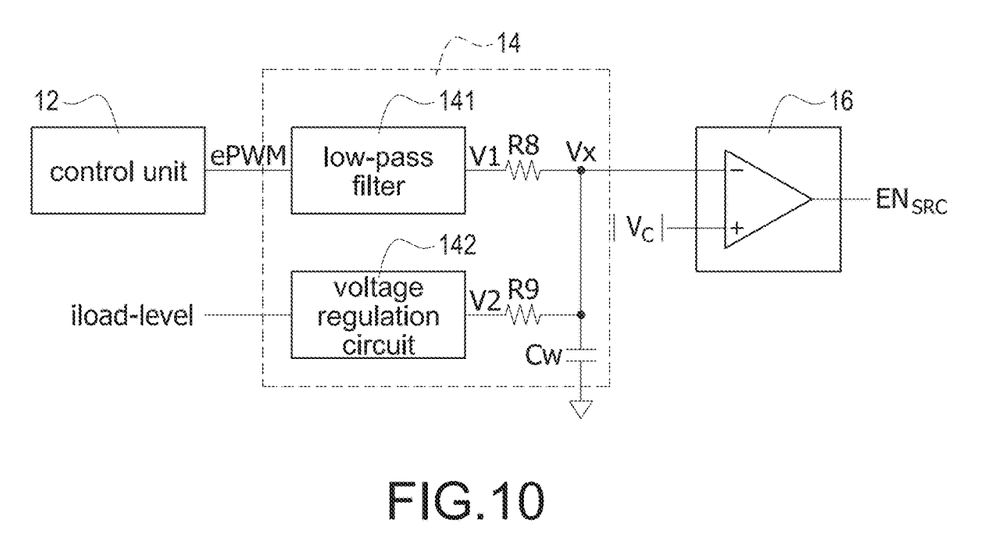
FIG. 10 is a block circuit diagram of the weighting unit applied to the power drive circuit according to the present disclosure.

Please refer to FIG. 9 and FIG. 10, which show a circuit diagram of a weighting unit and a block circuit diagram of applying the weighting unit to the power drive circuit according to the present disclosure, respectively. As shown in FIG. 9, the weighting unit 14 mainly has three ends, including a first input end of receiving a first voltage V1, a second input end of receiving a second voltage V2, and an output end of providing the trigger voltage Vx. Specifically, as shown in FIG. 10, the weighting unit 14 includes a low-pass filter 141, an eighth resistor R8, and a ninth resistor R9. The low-pass filter 141 receives the second PWM signal ePWM to output the average voltage V1 of the second PWM signal ePWM. A first end of the eighth resistor R8 receives the average voltage V1. A first end of the ninth resistor R9 is coupled to the trigger level signal iload-level, i.e., the voltage V2, and a second end of the ninth resistor R9 is connected to a second end of the eighth resistor R8 to generate the trigger voltage Vx.

The weighting unit 14 includes the eighth resistor R8, the ninth resistor R9, and a capacitor Cw. One end of the eighth resistor R8, one end of the ninth resistor R9, and one end of the capacitor Cw are commonly connected to the output end. The other end of the eighth resistor R8 is the first input end, the other end of the ninth resistor R9 is the second input end, and the other end of the capacitor Cw is connected to the ground end. Therefore, a relational formula between the trigger voltage Vx (output voltage), the first input voltage V1, and the second input voltage V2 of the weighting unit 14 is:

$$Vx=(V1{\times}R9)/(R8+R9)+(V2{\times}R8)/(R8+R9).$$

In the present disclosure, the first input voltage V1 is the average voltage of the second PWM signal ePWM and the second input voltage V2 is the trigger level signal iload-level.

It can be understood from the above formula, when the eighth resistor R8 and the ninth resistor R9 are fixed, the trigger voltage Vx is controlled by the first input voltage V1 and the second input voltage V2. When the first input voltage V1 and the second input voltage V2 both increase, the trigger voltage Vx increases; when the first input voltage V1 and the second input voltage V2 both decrease, the trigger voltage Vx decreases. When one of the first input voltage V1 and the second input voltage V2 increases and the other decreases, the trigger voltage Vx will respond according to the distribution (ratio) of the first input voltage V1 and the second input voltage V2.

When the combination of a microcontroller (i.e., the control unit 12) and a hardware circuit is implemented, the weighting unit 14 further includes a low-pass filter 141 and a voltage regulation circuit 142. The low-pass filter 141 is coupled to the eighth resistor R8, and receives the second PWM signal ePWM provided by the control unit 12 to convert a square-wave high-frequency signal into a DC signal, that is, the average voltage of the second PWM signal ePWM processed by the low-pass filter 141 is used as the first input voltage V1. The voltage regulation circuit 142 is coupled to the ninth resistor R9, and receives the trigger level signal iload-level to regulate the trigger level signal iload-level. Therefore, the voltage V2 is the regulated trigger level signal iload-level. In particular, the voltage regulation circuit 142 may be implemented by a capacitor or a voltage follower.

It is worth to be mentioned, when the SRC function is implemented by the hardware circuit, the trigger level signals, such as the current trigger level signal and the temperature trigger level signal can be correctly acquired. Since the trigger level of the trigger signal is usually implemented by generating an external fixed-voltage signal, however, the trigger signal needs to be modified/corrected by replacing components on the hardware circuit. Therefore, the flexibility of using the hardware circuit to adjust the trigger level is poor. In comparison with the hardware circuit, when the SRC function is implemented by integrating the firmware and the microcontroller, the trigger level can be easily adjusted by reading the input voltage, the output voltage, the load command, or the selected model of the power switch component. Since the input information of the firmware procedure is limited by the sampling speed of the microcontroller, however, the response speed of the slew rate control signal $EN_{SRC}$ is slower. Accordingly, the combination of the hardware circuit of acquiring the slew rate control signal $EN_{SRC}$ and firmware procedure of adjusting the trigger voltage Vx shown in FIG. 10 can acquire the advantages and features of the hardware circuit and the firmware procedure.

Figure 11A:
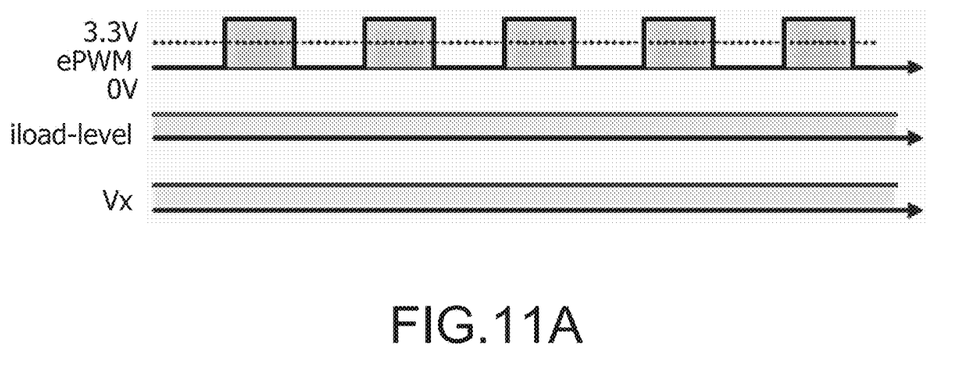
FIG. 11A to FIG. 11C are schematic waveforms of generating a trigger voltage according to the present disclosure.
Figure 11B:
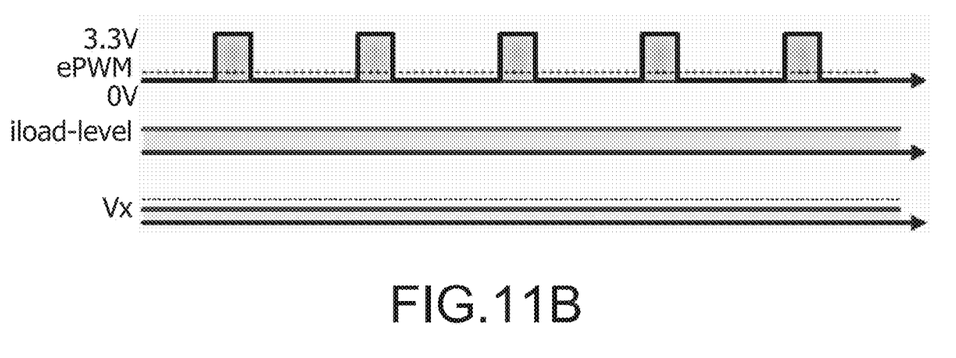
Figure 11C:
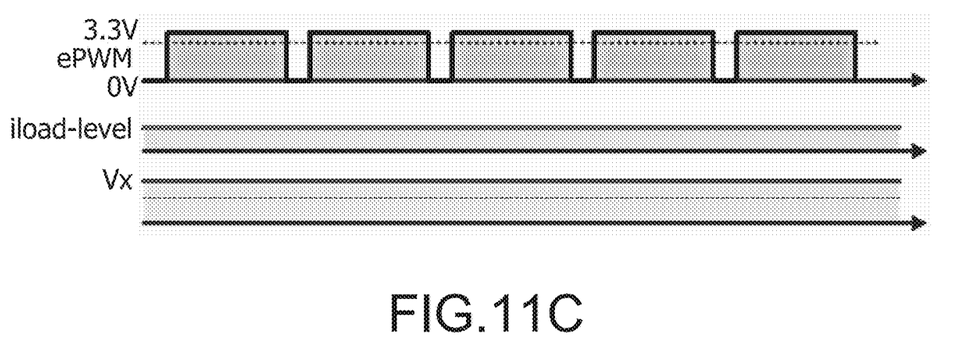

Please refer to FIG. 11A to FIG. 11C, which show schematic waveforms of the trigger voltage according to the present disclosure. According to different duty cycles of the second PWM signal ePWM and the fixed trigger level signal iload-level (only for convenience of description and without limiting the present disclosure), different trigger voltages Vx can be acquired. The average voltage of the second PWM signal ePWM is used as the first input voltage V1 of the weighting unit 14 and the trigger level signal iload-level is used as the second input voltage V2, and the above-mentioned relational formula is discussed as follows.

Take FIG. 11A as an example, the second PWM signal ePWM is outputted from the control unit 12, and the duty cycle of the second PWM signal ePWM is 50% and the magnitude of the second PWM signal ePWM is from 0 to 3.3 volts. The trigger level signal iload-level is generated by a hardware circuit, which is 1.65 volts. Further, it is assumed that the eighth resistor R8 and the ninth resistor R9 are identical. Therefore, the trigger voltage Vx can be calculated according to the above-mentioned relational formula:

$$Vx=(3.3{\times}50\%{\times}R9)/(R8+R9)+(1.65{\times}R8)/(R8+R9)$$
$$=1.65 \text{ volts.}$$

Take FIG. 11B as an example, the duty cycle of the second PWM signal ePWM is 25% and the magnitude of the second PWM signal ePWM is from 0 to 3.3 volts. The trigger level signal iload-level is fixed to be 1.65 volts. Further, it is assumed that the eighth resistor R8 and the ninth resistor R9 are identical. Therefore, the trigger voltage Vx can be calculated according to the above-mentioned relational formula:

$$Vx=(3.3{\times}25\%{\times}R9)/(R8+R9)+(1.65{\times}R8)/(R8+R9)$$
$$=1.2375 \text{ volts.}$$

Take FIG. 11C as an example, the duty cycle of the second PWM signal ePWM is 80% and the magnitude of the second PWM signal ePWM is from 0 to 3.3 volts. The trigger level signal iload-level is fixed to be 1.65 volts. Further, it is assumed that the eighth resistor R8 and the ninth resistor R9 are identical. Therefore, the trigger voltage Vx can be calculated according to the above-mentioned relational formula:

$$Vx=(3.3{\times}80\%{\times}R9)/(R8+R9)+(1.65{\times}R8)/(R8+R9)$$
$$=2.145 \text{ volts.}$$

Therefore, it can be acquired from the three examples shown in FIG. 11A to FIG. 11C: when the voltage of the trigger level signal iload-level does not change, the second PWM signal ePWM can still be adjusted by the firmware procedure in cooperation with the control unit 12 so as to control the voltage level of the trigger voltage Vx to achieve a more flexible trigger level correction.

Figure 12:
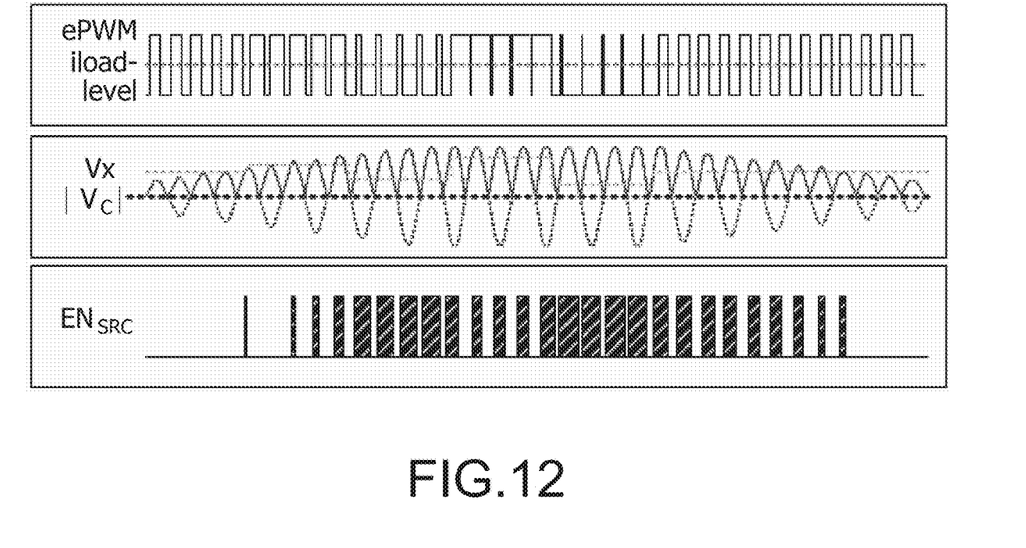
FIG. 12 is a schematic waveform of generating a slew rate control signal according to the present disclosure.

Please refer to FIG. 12, which show a schematic waveform of generating a slew rate control signal according to the present disclosure. The trigger voltage Vx, which is calculated through a weighting manner on the second PWM signal ePWM and the trigger level signal iload-level by the weighting unit 14, and the current absolute value waveform |Vc| are compared by the comparator 16. Please refer to FIG. 6, when the current absolute value waveform |Vc| is greater than (or is greater than or equal to) the trigger voltage Vx, the slew rate control signal $EN_{SRC}$ outputted from the comparator 16 is a high-level signal. The high-level slew rate control signal $EN_{SRC}$ controls the drive resistance setting values $R_{G-On1}$, $R_{G-On2}$ of the gate driver 31 to be parallel-connected and the drive resistance setting values $R_{G-Off1}$, $R_{G-Off2}$ of the gate driver 31 to be parallel-connected. Similarly, the same is true for the gate driver 32. Therefore, the drive resistance setting values of the gate driver 31 and the drive resistance setting values of the gate driver 32 both decrease. On the contrary, when the current absolute value waveform |Vc| is less than or equal to (or is less than) the trigger voltage Vx, the slew rate control signal $EN_{SRC}$ outputted from the comparator 16 is a low-level signal. The low-level slew rate control signal $EN_{SRC}$ restores the drive resistance setting values of the gate driver 31 depending on the turned-on or turned-off upper switch 21 to determine only the drive resistance setting value $R_{G-On1}$ operating or only the drive resistance setting value $R_{G-Off1}$ operating, or depending on the turned-on or turned-off lower switch 22 to determine only the drive resistance setting value $R_{G-On2}$ operating or only the drive resistance setting value $R_{G-Off2}$ operating. Similarly, the low-level slew rate control signal $EN_{SRC}$ restores the drive resistance setting values of the gate driver 32 depending on the turned-on or turned-off upper switch 21 to determine only the drive resistance setting value $R_{G-On1}$ operating or only the drive resistance setting value $R_{G-Off2}$ operating, or depending on the turned-on or turned-off lower switch 22 to determine only the drive resistance setting value $R_{G-On2}$ operating or only the drive resistance setting value $R_{G-Off2}$ operating.

Please refer to FIG. 6 again, the power conversion module 20 further includes a temperature sensor 23 for detecting a working temperature $V_T$ of the power conversion module 20. The temperature information of the working temperature $V_T$ is transmitted to the control unit 12. When the control unit 12 determines that the working temperature $V_T$ is higher than a temperature threshold value, the control unit 12 adjusts a duty cycle of the first PWM signal to be zero. According to the relational formula between the trigger voltage Vx, the first input voltage V1, and the second input voltage V2, therefore, the trigger voltage Vx calculated by the relational formula will be significantly smaller (reduced) once the duty cycle of the first PWM signal is zero. At this condition, the current absolute value waveform |Vc| is easily greater than the trigger voltage Vx so that the drive resistance setting values of the gate drivers 31, 32 can be decreased by the parallel-connected drive resistance setting values $R_{G-On1}$, $R_{G-On2}$ and the parallel-connected drive resistance setting values $R_{G-Off1}$, $R_{G-Off2}$ when the working temperature $V_T$ of the power conversion module 20 is too high.

Figure 13:
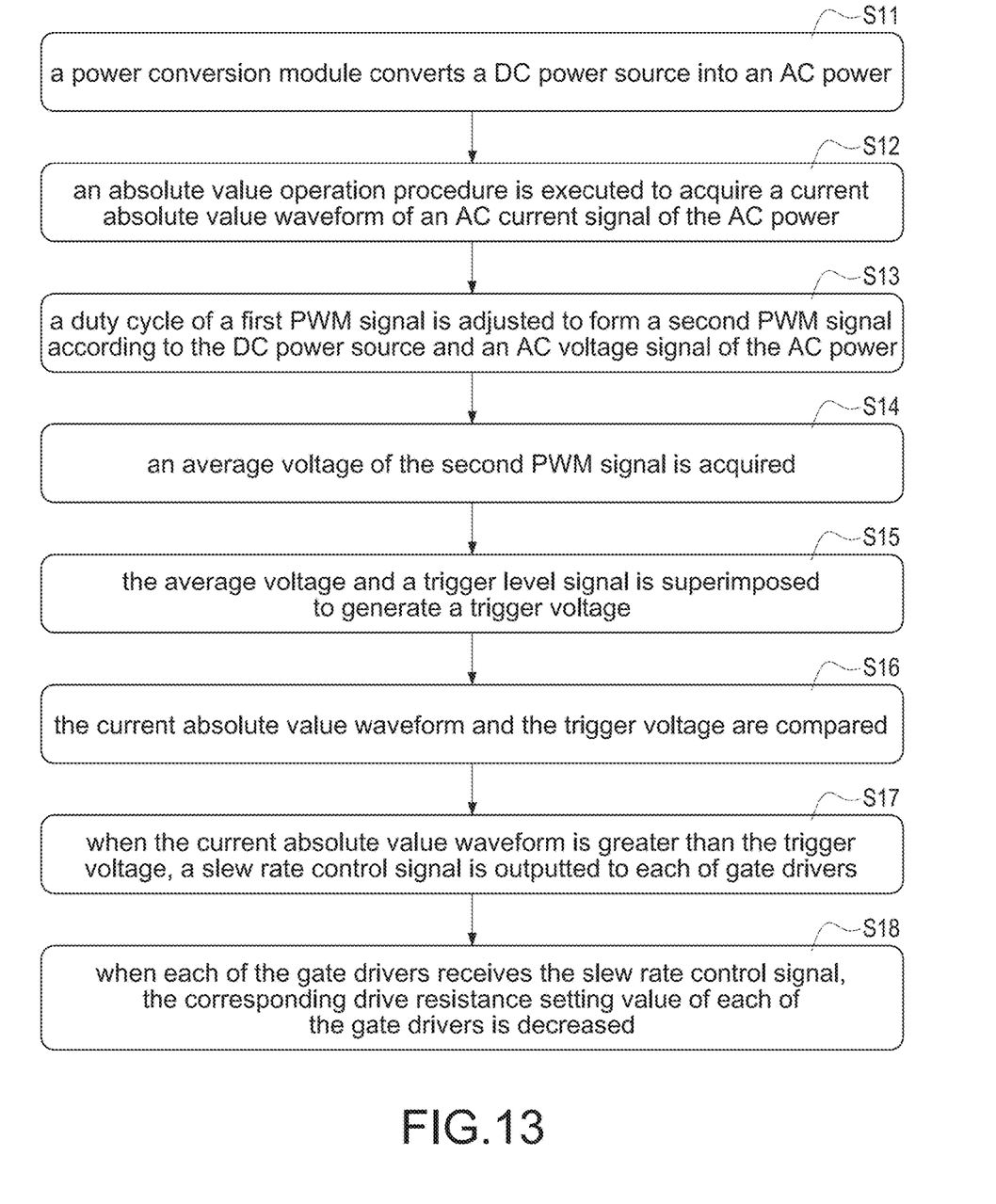
FIG. 13 is a flowchart of a method of operating the power drive circuit according to the present disclosure.

Please refer to FIG. 13, which shows a flowchart of a method of operating a power drive circuit according to the present disclosure. The method is applied to the power drive circuit, and the method includes the following steps. First, a power conversion module 20 converts a DC power source DC+, DC− into an AC power Vo (S11). Afterward, an absolute value operation procedure is executed to acquire a current absolute value waveform |Vc| of an AC current signal of the AC power Vo (S12). Afterward, a duty cycle of a first PWM signal is adjusted to form a second PWM signal ePWM according to the DC power source DC+, DC− and an AC voltage signal of the AC power Vo (S13). Afterward, an average voltage V1 of the second PWM signal ePWM is acquired (S14). Afterward, the average voltage V1 and a trigger level signal iload-level is superimposed to generate a trigger voltage Vx (S15). Afterward, the current absolute value waveform |Vc| and the trigger voltage Vx are compared (S16). When the current absolute value waveform |Vc| is greater than the trigger voltage Vx, a slew rate control signal $EN_{SRC}$ is outputted to each of the gate drivers 31, 32 (S17). When each of the gate drivers 31, 32 receives the slew rate control signal $EN_{SRC}$, the corresponding drive resistance setting value of each of the gate drivers 31, 32 is decreased (S18). For example, the drive resistance setting values $R_{G-On1}$, $R_{G-On2}$ are connected in parallel and the drive resistance setting values $R_{G-Off1}$, $R_{G-Off2}$ are connected in parallel.

In summary, the power drive circuit and the method of controlling the same are proposed to dynamically and flexibly adjust the drive resistance setting values of the gate drivers according to the optimization procedure to have a high-accurate SRC function activation capability in different occasions by adopting the characteristics of high response action of the hardware circuit to the sensing signal and using the weighting circuit combined with the firmware procedure. Furthermore, the man-machine interface or communication method may be used to allow users to customize the operation so as to improve the flexibility and diversity of use.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A power drive circuit comprising:
   a power conversion module comprising a plurality of switches, and the power conversion module configured to receive a DC power source and output an AC power,
   a plurality of gate drivers, each of the gate drivers correspondingly connected to a control end of each of the switches, and each of the gate drivers having a drive resistance setting value,
   a waveform processing unit coupled to an AC current signal of the AC power to output a current absolute value waveform of the AC current signal,
   a control unit configured to adjust a duty cycle of a first PWM signal according to the DC power source and an AC voltage signal of the AC power to output a second PWM signal,
   a weighting unit configured to acquire an average voltage of the second PWM signal and superimpose the average voltage and a trigger level signal to generate a trigger voltage, and
   a comparator configured to output a slew rate control signal to each of the gate drivers when the comparator determines that the current absolute value waveform is greater than the trigger voltage, wherein when each of the gate drivers receives the slew rate control signal, each of the gate drivers decreases the corresponding drive resistance setting value.

2. The power drive circuit as claimed in claim 1, wherein when the comparator determines that current absolute value waveform is not greater than the trigger voltage, the comparator stops outputting the slew rate control signal to restore the drive resistance setting value of each of the gate drivers.

3. The power drive circuit as claimed in claim 1, wherein the control unit further detects a working temperature of the power conversion module; when the control unit determines that the working temperature is higher than a temperature threshold value, the control unit adjusts the duty cycle of the first PWM signal to be zero.

4. The power drive circuit as claimed in claim 1, wherein the control unit controls the plurality of gate drivers to selectively turn on or turn off the switches according to the current absolute value waveform.

5. The power drive circuit as claimed in claim 1, wherein the waveform processing unit comprises:
a first operation unit configured to receive a reference voltage; wherein the first operation unit reverses the AC current signal to generate a first processing waveform, and the first operation unit retains a part of the first processing waveform lower than the reference voltage to form a second processing waveform, and
a second operation unit configured to amplify the second processing waveform to generate a third processing waveform, wherein the second operation unit superimposes the third processing waveform and the AC current signal to form a fourth processing waveform, wherein the second operation unit reverses the fourth processing waveform to output the current absolute value waveform.

6. The power drive circuit as claimed in claim 5, wherein the first operation unit comprises:
a first operational amplifier comprising a negative input end, a positive input end, and an output end,
a first resistor, wherein a first end of the first resistor is coupled to the AC current signal, and a second end of the first resistor is connected to the negative input end of the first operational amplifier,
a second resistor, wherein a first end of the second resistor is coupled to the reference voltage, and a second end of the second resistor is connected to the positive input end of the first operational amplifier,
a third resistor, wherein a first end of the third resistor is connected to the second end of the first resistor,
a first diode, wherein an anode of the first diode is connected to a second end of the third resistor, and
a second diode, wherein a cathode of the second diode is connected to the second end of the first resistor, and an anode of the second diode is connected to a cathode of the first diode and the output end of the first operational amplifier to produce the second processing waveform.

7. The power drive circuit as claimed in claim 6, wherein the second operation unit comprises:
a fourth resistor, wherein a first end of the fourth resistor is connected to the second end of the third resistor,
a fifth resistor, wherein a first end of the fifth resistor is connected to the first end of the first resistor, and a second end of the fifth resistor is connected to a second end of the fourth resistor,
a sixth resistor, wherein a first end of the sixth resistor is connected to the second end of the fifth resistor and the second end of the fourth resistor,
a second operational amplifier comprising a negative input end, a positive input end, and an output end; the negative input end of the second operational amplifier connected to the first end of the sixth resistor, and the output end of the second operational amplifier connected to a second end of the sixth resistor, and
a seventh resistor, wherein a first end of the seventh resistor is connected to the first end of the second resistor, and a second end of the seventh resistor is connected to the positive input end of the second operational amplifier.

8. The power drive circuit as claimed in claim 7, wherein a value of the fourth resistor is half a value of the sixth resistor.

9. The power drive circuit as claimed in claim 1, wherein the weighting unit comprises:
a low-pass filter configured to receive the second PWM signal to output the average voltage of the second PWM signal,
an eighth resistor, wherein a first end of the eighth resistor is configured to receive the average voltage, and
a ninth resistor, wherein a first end of the ninth resistor is coupled to the trigger level signal, and a second end of the ninth resistor is connected to a second end of the eighth resistor to generate the trigger voltage.

10. The power drive circuit as claimed in claim 9, wherein a relational formula between the trigger voltage, the average voltage, and the trigger level signal is:

$$Vx=(V1 \times R9)/(R8+R9)+(V2 \times R8)/(R8+R9),$$

wherein Vx is the trigger voltage, V1 is the average voltage of the second PWM signal, V2 is the trigger level signal, R8 is the eighth resistor, and R9 is the ninth resistor.

11. A control method applied to a power drive circuit, the power drive circuit comprising a power conversion module and a plurality of gate drivers, each of the gate drivers correspondingly connected to each of a plurality of switches of the power conversion module, and each of the gate drivers comprising a drive resistance setting value; the control method comprising steps of:
converting, by the power conversion module, a DC power source into an AC power,
executing an absolute value operation procedure to acquire a current absolute value waveform of an AC current signal of the AC power,
adjusting a duty cycle of a first PWM signal to form a second PWM signal according to the DC power source and an AC voltage signal of the AC power,
acquiring an average voltage of the second PWM signal,
superimposing the average voltage and a trigger level signal to generate a trigger voltage, and
comparing the current absolute value waveform and the trigger voltage,
wherein when the current absolute value waveform is greater than the trigger voltage, outputting a slew rate control signal to each of the gate drivers,
wherein when each of the gate drivers receives the slew rate control signal, decreasing the corresponding drive resistance setting value of each of the gate drivers.

12. The control method as claimed in claim 11, wherein when the current absolute value waveform is not greater than the trigger voltage, a comparator stops outputting the slew rate control signal to restore the drive resistance setting value of each of the gate drivers.

13. The control method as claimed in claim 11, further comprising steps of: detecting a working temperature of the power conversion module, and adjusting the duty cycle of the first PWM signal to be zero when the working temperature is higher than a temperature threshold value.

14. The control method as claimed in claim 11, further comprising a step of: controlling the gate drivers to selectively turn on or turn off the switches according to the current absolute value waveform.

15. The control method as claimed in claim 11, wherein the absolute value operation procedure comprises steps of:
- reversing the AC current signal to generate a first processing waveform,
- retaining a part of the first processing waveform lower than a reference voltage to form a second processing waveform,
- amplifying the second processing waveform to generate a third processing waveform,
- superimposing the third processing waveform and the AC current signal to form a fourth processing waveform, and
- reversing the fourth processing waveform to output the current absolute value waveform.

* * * * *